(12) United States Patent
Veeraraghavan et al.

(10) Patent No.: US 8,065,109 B2
(45) Date of Patent: Nov. 22, 2011

(54) LOCALIZED SUBSTRATE GEOMETRY CHARACTERIZATION

(75) Inventors: Sathish Veeraraghavan, Santa Clara, CA (US); Jaydeep K. Sinha, Livermore, CA (US); Rabi Fettig, Somerville, MA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 13/057,434

(22) PCT Filed: Aug. 28, 2009

(86) PCT No.: PCT/US2009/055313
§ 371 (c)(1),
(2), (4) Date: Feb. 3, 2011

(87) PCT Pub. No.: WO2010/025334
PCT Pub. Date: Mar. 4, 2010

(65) Prior Publication Data
US 2011/0144943 A1    Jun. 16, 2011

Related U.S. Application Data

(60) Provisional application No. 61/092,720, filed on Aug. 28, 2008.

(51) Int. Cl.
*G06F 15/00* (2006.01)
*G01B 11/24* (2006.01)

(52) U.S. Cl. ........ 702/166; 702/167; 702/170; 702/172; 702/179; 702/180; 702/181; 702/189; 702/190; 702/191; 702/193; 702/194

(58) Field of Classification Search ................... 702/166, 702/167, 170, 172, 179–181, 189–194; 438/5, 438/7, 14, 16; 703/2; 356/600, 237.2, 237.3
See application file for complete search history.

(56) References Cited

U.S. PATENT DOCUMENTS

| 6,503,767 B2 | 1/2003 | Korovin | |
| 7,161,669 B2 * | 1/2007 | Velidandla et al. | ........ 356/237.2 |
| 7,442,908 B2 * | 10/2008 | Schuster | ........ 250/201.2 |
| 2008/0018887 A1 | 1/2008 | Chen et al. | |

FOREIGN PATENT DOCUMENTS
WO    9915851 A1    4/1999
* cited by examiner

*Primary Examiner* — Sujoy Kundu
(74) *Attorney, Agent, or Firm* — Luedeka, Neely & Graham, P.C.

(57) ABSTRACT

A system for evaluating the metrological characteristics of a surface of a substrate, the system including an optical substrate measurement system, a data analyzing system for analyzing data in an evaluation area on the substrate, applying feature-specific filters to characterize the surface of the substrate, and produce surface-specific metrics for characterizing and quantifying a feature of interest, the surface-specific metrics including a range metric for quantifying maximum and minimum deviations in the evaluation area, a deviation metric for quantifying a point deviation having a largest magnitude in a set of point deviations, where the point deviations are an amount of deviation from a reference plane fit to the evaluation area, and a root mean square metric calculated from power spectral density.

49 Claims, 3 Drawing Sheets

|       |       |       |       | 56.4  | 44.7  | 26.1  |       |       |       |       |
|-------|-------|-------|-------|-------|-------|-------|-------|-------|-------|-------|
|       |       |       | 33.9  | 55.1  | 41.8  | 16.3  | 23.1  |       |       |       |
|       |       |       | 47.7  | 76.7  | 48.6  | 34.6  | 22.3  |       |       |       |
|       |       | 33.3  | 73.0  | 91.1  | 49.5  | 44.8  | 38.9  |       |       |       |
|       |       | 60.2  | 99.6  | 96.8  | -40.1 | -45.3 | 53.3  | 16.7  |       |       |
|       | 31.6  | 72.5  | 115.6 | 82.6  | -23.7 | -36.3 | 56.6  | 31.2  | 32.2  |       |
|       | 28.1  | 96.6  | 117.6 | -60.4 | -10.7 | -20.7 | -46.6 | 46.7  | 28.3  |       |
|       | 43.3  | 114.1 | 106.8 | -37.4 | -17.7 | -12.2 | -29.2 | 62.3  | 24.4  |       |
|       | 64.6  | 123.9 | 69.6  | -21.6 | -26.7 | -13.1 | -13.1 | 51.0  | 26.1  |       |
|       | 90.4  | 122.6 | 66.0  | -16.8 | -27.7 | -17.6 | -13.3 | -40.3 | 36.2  |       |
| 34.6  | 116.6 | 112.1 | -43.7 | -23.4 | -26.6 | -18.4 | -17.1 | -28.7 | 39.7  | 23.6  |
| 34.2  | 136.2 | 94.2  | -22.7 | -28.4 | 21.3  | 16.0  | -18.8 | -16.9 | 40.6  | 24.3  |
| 61.8  | 149.6 | -70.4 | -16.3 | -32.8 | 16.1  | 13.0  | -16.3 | -9.3  | 35.6  | 24.0  |
| 69.9  | 163.6 | -46.9 | -28.9 | -35.1 | 10.1  | 10.4  | 9.9   | -9.3  | 32.7  | 21.8  |
| 86.6  | 146.7 | -28.6 | -39.0 | 31.2  | 9.8   | 9.6   | 6.7   | -11.7 | 28.4  | 21.6  |
| 99.8  | 129.3 | -26.1 | -44.8 | 24.6  | 13.9  | 8.3   | 4.7   | -13.2 | 27.6  | 25.6  |
| 103.2 | -109.4| -36   | -45.8 | 17.2  | 17.0  | 6.3   | 6.0   | -15.2 | 28.1  | 28.9  |
| 100.2 | -89.3 | -44.8 | -37.9 | 10.4  | 19.0  | 6.8   | 4.9   | -13.6 | 29.9  | 32.6  |
| 69.7  | -73.6 | -48.9 | -27.6 | 11.4  | 25.4  | 5.9   | 6.3   | -12.0 | 34.3  | 32.6  |
| 72.9  | -68.9 | -44.7 | 18.4  | 14.8  | -10.5 | 6.1   | 7.1   | -9.0  | 38.7  | 32.1  |
| 69.7  | -61.6 | -36.4 | 11.5  | -12.8 | -10.0 | 4.2   | -7.6  | -5.4  | 42.1  | 30.6  |
| 44.8  | -46.6 | -22.4 | -8.3  | -6.8  | -9.7  | -5.7  | -7.3  | -8.4  | 44.6  | 27.9  |
| 28.7  | 44.3  | -12.2 | -6.9  | -4.5  | -6.2  | -7.6  | -4.4  | 15.6  | 48.6  | 23.8  |
| 25.9  | 40.7  | 15.6  | -6.4  | -6.0  | -4.2  | -6.7  | -5.0  | 22.6  | 46.4  | 25.2  |
| 28.6  | 36.6  | 26.2  | -7.2  | -5.5  | -5.0  | -5.8  | -10.9 | 30.0  | 45.8  | 28.6  |
| 28.6  | 32.0  | 29.9  | -11.0 | -5.5  | -6.4  | -4.4  | -16.7 | 37.5  | 42.1  | 28.6  |
| 28.5  | 25.1  | 32.4  | 16.7  | -5.9  | -6.7  | -8.6  | 25.8  | 44.3  | 34.6  | 29.1  |
|       | 17.2  | 30.6  | 19.5  | 10.8  | -8.6  | 16.1  | 34.1  | 47.3  | 25.6  |       |
|       | 10.5  | 21.8  | 20.6  | 16.9  | 11.0  | 24.1  | 40.3  | 43.9  | 13.6  |       |
|       | 28.0  | 13.8  | 18.7  | 19.1  | 12.6  | 29.8  | 42.3  | 34.1  | 29.7  |       |
|       | 30.4  | 6.6   | 12.7  | 16.8  | 16.9  | 36.4  | 34.4  | 22.9  | 33.1  |       |
|       |       | 33.9  | 10.2  | 7.0   | 11.0  | 17.9  | 31.0  | 25.3  | 13.2  | 32.3  |
|       |       |       | 12.2  | 4.4   | 7.0   | 19.0  | 21.2  | 16.4  | 9.3   |       |
|       |       |       | 32.4  | 6.7   | 11.3  | 17.2  | 13.3  | 11.1  | 26.9  |       |
|       |       |       |       | 6.7   | 16.6  | 16.3  | 7.1   | 10.6  |       |       |
|       |       |       |       | 26.3  | 20.8  | 16.1  | 6.8   | 27.9  |       |       |
|       |       |       |       |       | 62.8  | 60.0  | 27.0  |       |       |       |

SS-SBIR

Fig. 2

LOCALIZED SUBSTRATE GEOMETRY CHARACTERIZATION

This application claims all rights and priority on U.S. provisional patent application Ser. No. 61/092,720 filed 2008, Aug. 28 and PCT/US09/055,313 filed 2009, Aug. 28, the entirety of which is incorporated herein by reference. This invention relates to the field of integrated circuit fabrication. More particularly, this invention relates to processing substrate surface measurements to create metrics that are used for classification and sorting of the substrates.

BACKGROUND

Field

Integrated circuits are predominantly fabricated on monolithic substrates, where hundreds or thousands of separate integrated circuits are simultaneous fabricated on a single substrate. As the term is used herein, "integrated circuit" includes devices such as those formed on monolithic semiconducting substrates, such as those formed of group IV materials like Silicon or Germanium, or group III-V compounds like Gallium Arsenide, or mixtures of such materials. The term includes all types of devices formed, such as memory and logic, and all designs of such devices, such as MOS and bipolar. The term also comprehends applications such as flat panel displays, solar cells, and charge coupled devices.

Because the features of modern integrated circuits are so small, and the tolerances that are required are so tight, substrates are rigorously characterized prior to the start of such processing to ensure that a given substrate is suitable for the integrated circuits that will be formed thereon. As node sizes of integrated circuits have decreased, and continue to decrease, this characterization of the substrates geometry has become increasingly important.

Substrate geometry has typically been classified with low frequency components such as shape, and flatness. Shape is traditionally defined as the deviation of the median surface of a substrate from a reference plane, and is characterized by global metrics such as warp and bow. Flatness is defined as the thickness variation of a substrate with the back surface assumed to be completely flat, and is characterized by site-based metrics such as SFQR (site front surface least square fit plane range).

Traditionally, shape characterization is performed using methods that take into account large variations across the entire surface of the substrate. However, the higher order components of substrate shape that are completely contained within a smaller portion of the substrate, and which generally do not impact the global shape metrics such as substrate warp and bow. In the past, the effect of higher order shape did not play a critical role for larger node technologies. However, tighter defocus and overlay budgets at smaller nodes have made higher order shape effects more important. Yet there are no metrics that define and quantify the higher order components of substrate shape.

In addition, there are parts of the substrate with uncontrolled geometry features, created due to specific processes. These areas of the substrate might not have been used in the past for forming integrated circuits, or the integrated circuits that were patterned over these areas might have been automatically written off as being unusable. However, fabricators now have incentives to use as much of the substrate surface area as possible for salable integrated circuits, and so these so-called localized features are important when these areas of the substrate are used for integrated circuits.

For example, one of the localized regions of interest is the substrate notch.

Traditionally, a large region near the notch is excluded during substrate flatness characterization. However, several of the lithography fields that are used to form nearby integrated circuits can be affected by variations in the geometry of the substrate near the notch. Thus, these localized features such as notches, laser marks, epitaxial marks, and so forth, strongly impact the suitability of a given substrate for lithography processes, chemical mechanical polishing, and other types of processing. Yet once again, there are currently no metrics available to capture, characterize, and quantify these features.

What is needed, therefore, is a system that resolves deficiencies such as those described above, at least in part.

SUMMARY

The above and other needs are met by a system for evaluating the metrological characteristics of a surface of a substrate, the system including an optical substrate measurement system, a data analyzing system for analyzing data in an evaluation area on the substrate, applying feature-specific filters to characterize the surface of the substrate, and produce surface-specific metrics for characterizing and quantifying a feature of interest, the surface-specific metrics including a range metric for quantifying maximum and minimum deviations in the evaluation area, a deviation metric for quantifying a point deviation having a largest magnitude in a set of point deviations, where the point deviations are an amount of deviation from a reference plane fit to the evaluation area, and a root mean square metric calculated from power spectral density.

In this manner, various embodiments of the present invention reduce the problems that are inherent with the prior art. For example, prior art shape measurements characterize shape and flatness in reference to the back side of the substrate. In other words, the back side of the substrate is chucked, and the back side plane is assumed to be flat and taken as a reference plane. The front side of the substrate is then measured, with all measurements being referenced to that back-side plane of the substrate. However, in the various embodiments of the present invention, the substrate is held vertically in a free state, as described in more detail hereafter, and the shape and flatness metrics are computed for one surface without reference to another surface.

Thus, prior art metrics are thickness-based (the thickness of the substrate), whereas the metrics described herein are surface-based. In the embodiments described herein, the low frequency components of shape are removed by filtering techniques, leaving just the higher order components of localized features, which are then reported with the new metrics. While shape continues to be important to substrate characterization, the methods described herein enable the use of the higher order components of shape for substrate characterization, which has not been done before.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein:

FIG. 2. depicts a slope shape map that is used to characterize the higher order substrate shape, according to an embodiment of the present invention.

DETAILED DESCRIPTION

The embodiments of the present invention fill the needs described above by defining metrics that are suitable for the characterization and quantification of both (a) higher order components of substrate shape and (b) localized features. This enables an enhanced ability to classify substrates and sort them based on such factors.

Figure 1:
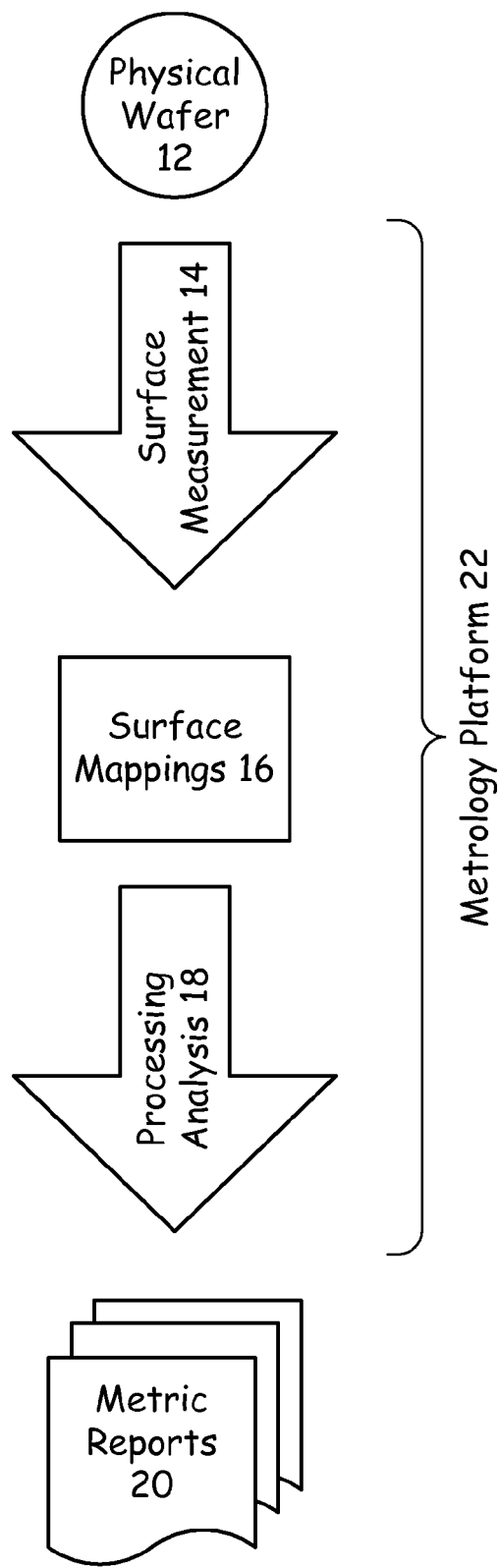
FIG. 1. depicts the point in a substrate characterization process in which various embodiments of the present invention are employed.

FIG. 1 depicts a flow chart of the overview of a characterization process 10 for a substrate 12. Surface measurements are taken of the substrate 12, as given in block 14, and the measurements are transformed into a map of the substrate surface, as given in block 16. In the past, substrate shape has been determined with the substrate chucked, where it was assumed that the back of the substrate was level and even. The metrics defined herein are based on measurement of the substrate in a free state, where the substrate is held vertically at only a few points by finger-like pincers, so that the shape of the back surface does not affect the shape of the front surface of the substrate. Further, the measurement process of the present invention uses much higher resolution measurements than the prior art, in some embodiments.

Next, an analysis 18 is performed to determine the suitability of the substrate 12 for various processes. Finally, metric reports 20 are generated, indicating the results of the analysis 18. These steps can all be accomplished within the metrology tool 22, which accepts substrates 12 and produces the reports 20. A tool 22 according to the present invention performs analysis 18 that has not been performed previously, and determines and reports metrics that have not been previously known or used. These general steps are described in more detail in the sections that follow.

Higher Order Shape Characterization

Two novel metrics have been developed to characterize higher order shape, including (a) shape slope site back surface ideal reference range—SS-SBIR (referred to as slope shape herein), and (b) substrate shape characterization in the frequency domain (referred to as frequency shape herein).

Slope Shape

Slope shape uses the slope of the substrate surface to capture the higher order shape of the substrate. In a first step, the topography of the substrate surface is sensed at a relatively high density using an optical tool. For example, measurements are taken with a spatial resolution of about two hundred microns. These surface measurements are combined into a shape map of the substrate. Next, the slope of the substrate surface at each measurement point is calculated, using the neighboring points as references. Then the substrate is divided into sections, and the slope shape metric is calculated for each section. The size of the substrate sections can be user-definable, such as the size of the lithography site for the integrated circuits to be formed on the substrate. For example, the section can have dimensions of about twenty-six millimeters by about eight millimeters. Thus, different section sizes can be specified for different integrated circuits, as desired.

A slope shape map for the substrate is constructed, as depicted in FIG. 2, which map can depict a variety of information. For example, the slope shape map can depict the range of slope shape for all of the points within a given section of the substrate. The slope shape map can flag those sections of the substrate where the range of slope shape for the points within the section exceeds a specific threshold. A global slope shape metric for the entire substrate (such as the maximum of all ranges of the slope shapes) can indicate whether the threshold is violated anywhere on the substrate.

In one embodiment, the threshold is determined by process relevance. For example, the lithography processes for a technology node and given process parameters might demand certain surface properties in order for the integrated circuits to be properly formed. If the slope in any lithography site exceeds a certain threshold, then the patterned features in that particular site would fail to meet the required specifications. Thus, if the global shape metric for the substrate exceeds the threshold, then that is an indication that certain sections of the substrate would not meet the specification, and that substrate can be sorted accordingly.

Frequency Shape

Figure 3:
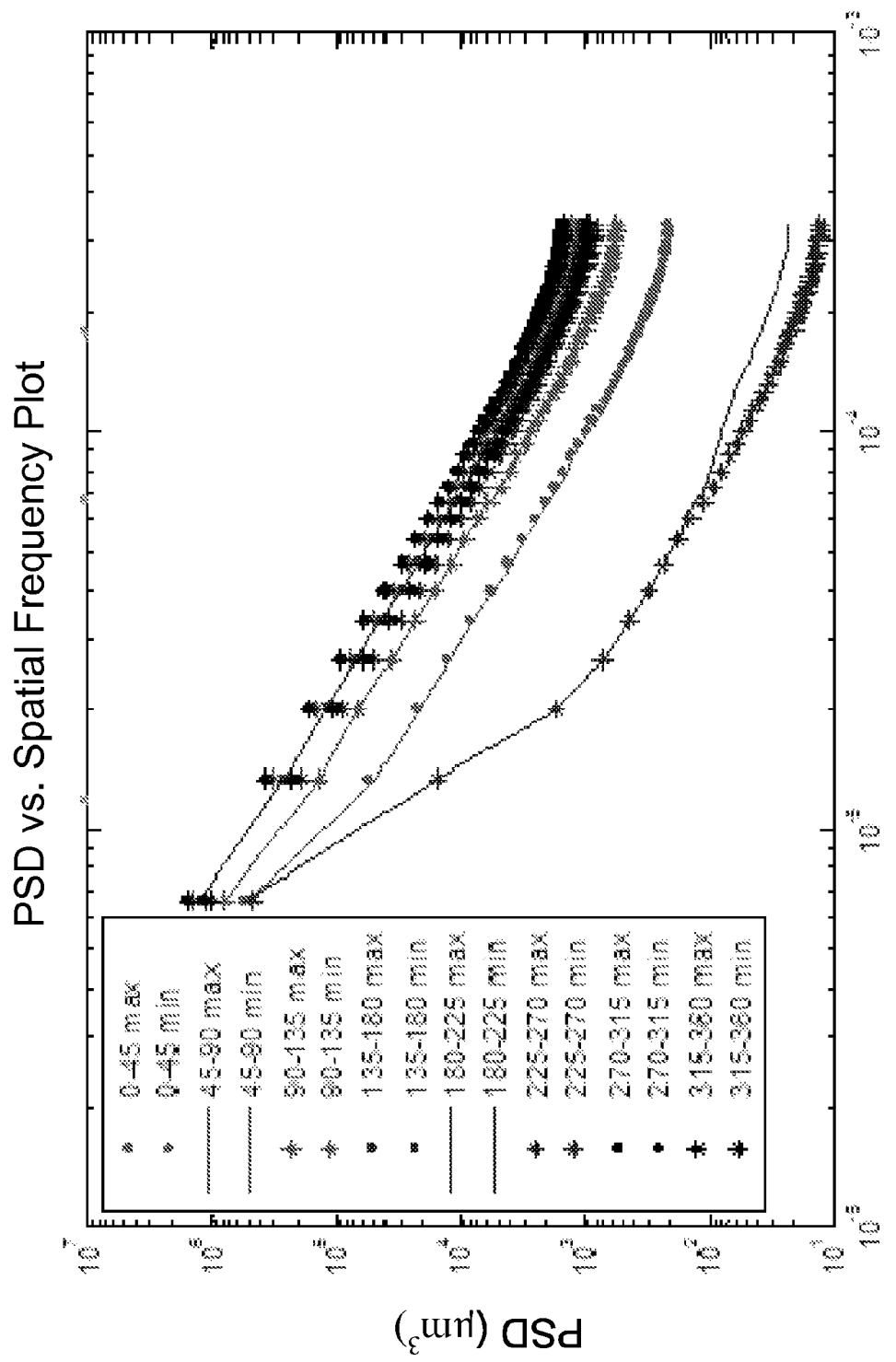
FIG. 3. depicts a plot of spatial frequency versus power spectral density that is used to determine the root mean square power spectral density metric that is used to characterize the higher order shape data for a substrate, according to an embodiment of the present invention.

To characterize the substrate shape in the frequency domain, the one-dimensional power spectral density is calculated along the radial lines through Fourier transformation. Alternately, the power spectral density could be calculated for circumferential rings on the substrate surface for a user-defined section size. First, the shape map of the substrate (constructed as described above in regard to slope shape) is converted from Cartesian coordinates into polar coordinates, and radial profiles are obtained at specific user-defined intervals. The topography along these cross-sectional radial lines of the substrate has a signal-like appearance. The power spectral densities for these signal-like radial lines are calculated at a range of spatial frequencies, and a plot of power spectral density versus spatial frequency is produced, as depicted in FIG. 3.

However, this shape information in the frequency domain is not directly used for characterization of the substrate. To characterize the frequency shape of the substrate, a localized metric PSD-RMS$_f$ is calculated at a particular frequency by taking the area under the power spectral density versus spatial frequency plot at a particular frequency. The PSD-RMS$_f$ metric can be used for substrate sorting and localized higher order shape characterization similar to the slope shape metric described in the previous section.

Localized Feature Characterization

The evaluation of the substrate surface in a localized region, such as at a notch, laser mark, or epitaxial pin position, is performed according to the following steps: (1) the probable locations and sizes of the localized features of interest are identified; (2) a suitable metric for the quantification of the relevant feature is defined (descriptions for a few embodiments of these metrics are provided below); (3) a recipe that evaluates the relevant metrics over the area that is local to those features is written; and (4) the substrates are classified and sorted based on their localized feature characteristics.

Methodology

The quantification of these localized features requires specialized metrics that have not been previously defined. These metrics are applied to only one surface of the substrate at a time, be it front, back, or thickness, depending upon which surface is more sensitive to the feature of interest. As an example, the laser mark that has sharp geometry variations in a relatively small spatial distance is present only in the back surface of the substrate.

These metrics are computed for a given area around a local feature of interest, such as disposed in either the front surface or the back surface of the substrate. These localized features are present in different parts of the substrate and have different characteristics. Localized feature metrics according to the present invention provide the flexibility to define an area around the feature of interest, apply different filtering methods, and characterize and quantify a localized feature. Features such as notch and laser mark are usually disposed in a specific location on the substrate, and thus the methods herein can operate on a pre-defined area of the substrate for those features. Other features might not always be in the same location for all substrates, and thus either automated feature location routines or user-defined feature locating can be employed. Features of interest might be present on a specific surface of the substrate, and generate the best signal when characterized using that particular surface. For example, laser marks are formed on the back surface of the substrate, and are thus best characterized using the back surface. Some features are present in both the front and back surface of the substrate, but still might not be observed using the thickness data on which prior art methods are based.

The data for the computation of these metrics is generated by the following process. The surface measurements from the substrate are mathematically treated with filtering routines to remove the shape component of the measurements and thereby focus on the local feature of interest. A least-squares regression removes the tilt and mean height from the given area that is being measured around the local feature. Specific metrics are then calculated as described in the sections below.

BSFQR/FSFQR

The peak-to-valley range of height values within the given area are reported as BSFQR for the back surface of the substrate and as FSFQR for the front surface of the substrate. This metric is similar to the SEMI standard SFQR, except that it references individual surfaces of the substrate rather than substrate thickness, because the substrate is held in a free state as described above, and the front surface is not measured in relationship to the back surface, as would occur with a chucked substrate.

BSFQD/FSFQD

If the magnitude of the lowest (most negative) height in the surface of the substrate within the given area is greater in magnitude than the highest (most positive) height by a tolerance value, then the lowest value is reported as BSFQD for the back surface and FSFQD for the front surface. If the magnitude of the lowest (most negative) height in the surface of the substrate is lesser in magnitude than the highest (most positive) height, then the highest value is reported as BSFQD for the back surface and FSFQD for the front surface. This metric is similar to the SEMI standard SFQD, except for the tolerance value and the fact that it references individual substrate surfaces (measurements in a free state) rather than substrate thickness (measurements with the back side of the surface chucked and used as a reference surface).

Filtering and Automation

Other surfaces (such as front, back, thickness, curvature, etc.) can be used to compute metrics of interest. These metrics are not limited to the deviation or range type metrics, such as those described above by way of example. Other types of metrics may be used. Other surface fitting schemes (besides a least-squares plane) can also be fit to the regions of interest. The surfaces may be filtered (as introduced above) before computation of the metrics, such as by double-Gaussian filtering, higher order polynomial filtering, and so forth. Different features fall under different spatial frequency domains. For example, notch is a lower spatial frequency feature compared to epitaxial pin marks. Thus there is a need for different filtering schemes to capture these different features that have different characteristics. Lower order filtering methods are generally used for lower order features and higher order filtering methods (such as Laplacian curvature, for example) are generally used for higher order feature characterization.

The methods according to the present invention can also be used in the automatic detection of localized features, and can automatically select appropriate portions of the substrate for characterization and quantification. With the implementation of such automatic feature detection, the process becomes entirely parameter-free and universal.

This process of automated feature detection consists of the following steps: (1) create a localized curvature map of the surface of the substrate (as described in the next section), where the curvature mapping process automatically detects the features of interest and creates a boundary for a section around these features; (2) generate a binary feature map (defined by the curvature>threshold at a given point or within a given section); (3) successively grow and erode the map to ensure that the edges of the features are connected; (4) isolate and enumerate contiguous sections of the processed binary feature map; (5) find the edges of the boundary of each section in order to define a section center and a section size; (6) generate a list of sections for localized feature detection, where each section is concentric with a feature and slightly larger in size; (7) compute localized feature characterization metrics over each section (such as those described in the sections above); and (8) compare the feature map to one or more process-dependent threshold limits, to flag those substrates with the BSFQR/D, FSFQR/D metric values that are above a given threshold, and therefore unsuitable for the process with which the given process-dependent threshold limit is associated.

The curvature mapping process automatically selects the regions with the localized features of interest, and in those specific areas the metrics are calculated to characterize and quantify the feature of interest. There are some known features, such as laser mark and notch, where the position on the substrate of the feature is known to the user, and thus a user-defined area can be created to characterize the feature. However, in the case of features such as epitaxial pin marks or higher order shape, the region is not previously known to the user, and thus a slope or curvature map can be used to find the feature of interest, define the regions, and calculate the metrics.

Curvature Mapping

This section describe in-depth one exemplary method for the creation of the curvature map as introduced above, which uses a novel method to approximate the Laplacian using a discrete convolution. Provided here is a method for the creation of a pixel-by-pixel map of localized curvature on the surface of a substrate, such as to discover and characterize localized features on a substrate.

The formulae for the center-differenced estimation of curvature in a discrete function using 3 and 5 points, respectively, are:

$$f''(x_i) = \frac{1}{l^2} f(x_{i-1}) - \frac{2}{l^2 f(x_i)} + \frac{1}{l^2} f(x_{i+1}) \qquad \text{Equation 1}$$

and

-continued $$f''(x_i) = -\frac{1}{12l^2}f(x_{i-2}) + \frac{4}{3l^2}f(x_{i-1}) - \frac{5}{2l^2}f(x_i) + \frac{4}{3l^2}f(x_{i+1}) - \frac{1}{12l^2}f(x_{i+1})$$

Equation 2

In the preceding equations, f is the function in question, x is an independent variable, f" is the second derivative of the function, i is the point at which the derivative is being evaluated, and l is the distance between points being evaluated.

These equations can be adapted to compute a Laplacian, in which case they will take on the following forms:

$$\nabla^2 f(x_i, y_i) = \frac{1}{l_x^2}f(x_{i-1}, y_i) - \frac{2}{l_x^2}f(x_i - y_i) + \frac{1}{l_x^2}f(x_{i+1}, y_i) + \frac{1}{l_y^2}f(x_i, y_i) + \frac{1}{l_y^2}f(x_i, y_{i+1})$$

Equation 3 and $$\nabla^2 f(x_i, y_i) =$$

Equation 4

$$\begin{pmatrix} -\frac{1}{12l_x^2}f(x_{i-2}, y_i) + \frac{4}{3l_x^2}f(x_{i-1}, y_i) - \frac{5}{2l_x^2}f(x_i, y_i) + \\ \frac{4}{3l_x^2}f(x_{i+1}, y_i) - \frac{1}{12l_y^2}f(x_{i+2}, y_i) \\ -\frac{1}{12l_y^2}f(x_i, y_{i-2}) + \frac{4}{3l_y^2}f(x_i, y_{i-1}) - \frac{5}{2l_y^2}f(x_i, y_i) + \\ \frac{4}{3l_y^2}f(x_i, y_{i+1}) - \frac{1}{12l_y^2}f(x_i, y_{i+2}) \end{pmatrix}$$

Where all variables are the same as above, and additionally y is a second independent variable, $l_x$ is the distance between x points, and $l_y$ is the distance between y points. These equations can be further reduced for the case where $l_x$ is identical to $l_y$. Expressed as a discrete convolution kernel, this yields the following:

$$cf_3 = \frac{1}{l^2}\begin{pmatrix} 0 & 1 & 0 \\ 1 & -4 & 1 \\ 0 & 1 & 0 \end{pmatrix}$$

Equation 5 and $$cf_5 = \frac{1}{l^2}\begin{pmatrix} 0 & 0 & \frac{-1}{12} & 0 & 0 \\ 0 & 0 & \frac{4}{3} & 0 & 0 \\ \frac{-1}{12} & \frac{4}{3} & -5 & \frac{4}{3} & \frac{-1}{12} \\ 0 & 0 & \frac{4}{3} & 0 & 0 \\ 0 & 0 & \frac{-1}{12} & 0 & 0 \end{pmatrix}$$

Equation 6

In this form, the convolution of a particular kernel with the mapping of a function will provide for the mapping of the Laplacian, as in:

$$\nabla^2 f(x,y) = (f \cdot cf)(x,y)$$

Equation 7

In practice, convolution with either kernel provides a good estimator of localized curvature. The $cf_5$ kernel provides a significantly improved accuracy and signal to noise ratio as compared with the $cf_3$ kernel, although it does provide reduced sensitivity. The signal to noise ratio of this method can further be improved if it is assumed that all features of interest will affect curvature over multiple points in a region. A weighted average of curvatures can be computed over a region, such as:

$$\nabla^2 f(x, y) = \begin{pmatrix} & \frac{1}{8}\nabla^2 f(x_i, y_{i+1}) & \\ \frac{1}{8}\nabla^2 f(x_{i-1}, y_i) & \frac{1}{2}\nabla^2 f(x_i, y_i) & \frac{1}{8}\nabla^2 f(x_{i+1}, y_i) \\ & \frac{1}{8}\nabla^2 f(x_i, y_{i-1}) & \end{pmatrix}$$

Equation 8

Since points further from the center carry lower weightings, it is possible to use a high order of accuracy ($cf_5$) for the center point, and to use a lower order of accuracy ($cf_3$) in the rest without sacrificing accuracy in the overall computation. Also, since $cf_3$ uses a smaller area to compute curvature, the overall area included would be no greater than that of $cf_5$. This means that sensitivity would not be significantly reduced from $cf_5$. The hybrid convolution kernel, or ch, would take the form of:

$$ch = \begin{pmatrix} 0 & \frac{1}{8}cf_3 & 0 \\ \frac{1}{8}cf_3 & \frac{1}{2}cf_5 & \frac{1}{8}cf_3 \\ 0 & \frac{1}{8}cf_3 & 0 \end{pmatrix}$$

Equation 9

$$= \frac{1}{l^2}\begin{pmatrix} 0 & 0 & \frac{1}{12} & 0 & 0 \\ 0 & \frac{1}{4} & \frac{1}{6} & \frac{1}{4} & 0 \\ \frac{1}{12} & \frac{1}{6} & -2 & \frac{1}{6} & \frac{1}{12} \\ 0 & \frac{1}{4} & \frac{1}{6} & \frac{1}{4} & 0 \\ 0 & 0 & \frac{1}{12} & 0 & 0 \end{pmatrix}$$

This assumes that pixels are square. The more general form is:

$$ch =$$

Equation 10

$$\frac{1}{l_x^2}\begin{pmatrix} 0 & 0 & 0 & 0 & 0 \\ 0 & \frac{1}{8} & \frac{-1}{4} & \frac{1}{8} & 0 \\ \frac{1}{12} & \frac{5}{12} & -1 & \frac{5}{12} & \frac{1}{12} \\ 0 & \frac{1}{8} & \frac{-1}{4} & \frac{1}{8} & 0 \\ 0 & 0 & 0 & 0 & 0 \end{pmatrix} + \frac{1}{l_y^2}\begin{pmatrix} 0 & 0 & \frac{1}{12} & 0 & 0 \\ 0 & \frac{1}{8} & \frac{5}{12} & \frac{1}{8} & 0 \\ 0 & \frac{-1}{4} & -1 & \frac{-1}{4} & 0 \\ 0 & \frac{1}{8} & \frac{5}{12} & \frac{1}{8} & 0 \\ 0 & 0 & \frac{1}{12} & 0 & 0 \end{pmatrix}$$

Curvature maps generated using Equation 7 with the ch kernel display localized features prominently. The current focus of this method is the quantification of localized features on substrates such as semiconductor wafers, although the method is not specific to the application.

Advantages

The embodiments of the present invention provide an objective, quantitative method for characterizing and sorting substrates according to their features, such as in regard to the suitability of a given substrate for a given process flow. There is no existing method available to perform this function, because these features have only gained interest due to the new tight defocus and overlay budgets for smaller nodes. The metrics are extracted by applying optimized filtering schemes to individual substrate surfaces, rather than being based on confounded measurements where the front surface of the substrate is measured in reference to the back surface of the substrate. Current existing metrics such as warp, bow, and THA are global in nature and do not characterize the features of interest accurately. The localized metrics as developed and discussed herein characterize these localized features of interest effectively.

Thus, the methods as described here characterize substrate shape in the frequency and slope domain, which has not been previously known or accomplished. These methods provide quantification of localized features, characterize individual substrate surfaces without respect of the one to the other, permit the use of user-defined sections on the substrate, and take advantage of localized curvature mapping for the identification of features and automatic feature detection.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A system for evaluating the metrological characteristics of a surface of a substrate, comprising:
   an optical substrate measurement system for measuring the surface of the substrate, and
   a data analyzing system for analyzing data in an evaluation area defined on a substrate, and applying feature-specific filtering schemes to characterize the surface of the substrate, and to use surface-specific metrics for characterizing and quantifying a feature of interest,
   the surface-specific metrics comprising a range metric for quantifying maximum and minimum deviations on the evaluation area, a deviation metric for quantifying a point deviation having a largest magnitude in a set of point deviations, each of the point deviations comprising an amount of deviation from a reference plane fit to the evaluation area, and a root mean square metric calculated from power spectral density,
   the data analyzing system further for comparing the metrics with a threshold, and sorting the substrates based at least in part upon the comparison.

2. The system of claim 1, wherein the surface of the substrate comprises a front, a back, a shape defined as a median surface obtained from the front and the back surface, a flatness defined as a thickness variation of the substrate with the back surface taken as a flat reference.

3. The system of claim 1, having a capability to capture features of interest in both a low spatial frequency domain and a high spatial frequency domain.

4. The system of claim 3, wherein a feature of interest in the low spatial frequency domain includes at least one of notch, near notch area, laser mark, near laser mark area, and higher order shape.

5. The system of claim 3, wherein a feature of interest in the high spatial frequency domain includes epitaxial pin marks.

6. The system of claim 4, wherein higher order shape is change in the substrate shape within a short spatial wavelength.

7. The system of claim 4, wherein higher order shape is characterized by analyzing the substrate shape in a slope domain.

8. The system of claim 7, wherein the substrate shape is used to compute a point by point slope of the shape using neighboring points.

9. The system of claim 7, wherein the substrate shape in the slope domain is determined separately within each evaluation area.

10. The system of claim 9, wherein the range metric is computed in the evaluation area and is used to evaluate a slope of the substrate shape in the evaluation area.

11. The system of claim 7, wherein the range metric is used to sort the substrates by comparing it with a process driven cut-off value for a localized shape slope.

12. The system of claim 4, wherein higher order shape is characterized by analyzing the substrate shape in a spatial frequency domain.

13. The system of claim 11, wherein substrate shape data is converted into at least one of one-dimensional power spectral density and a two-dimensional power spectral density in a frequency domain through Fourier transform.

14. The system of claim 13, wherein the one-dimensional power spectral density is computed on at least one of a radial one-dimensional profile, a circumferential one-dimensional profile, and a none-radial, non-circumferential line segment on the substrate.

15. The system of claim 13, wherein the two-dimensional power spectral density is computed on a user-defined rectangular section of the substrate.

16. The system of claim 13, wherein a plot of power spectral density versus spatial frequency is computed from at least one of the one-dimensional power spectral density and the two-dimensional power spectral density.

17. The system of claim 16, wherein the root mean square metric is computed from the plot of power spectral density versus spatial frequency and used to quantify the higher order shape.

18. The system of claim 16, wherein the root mean square metric is calculated at a specific frequency by calculating a square root of an area under the plot of power spectral density versus spatial frequency.

19. The system of claim 1, wherein the root mean square metric is used to sort the substrate by comparing it with a process driven cut-off value.

20. The system of claim 4, wherein the notch and the near notch area are evaluated with a spatial resolution of about two hundred microns.

21. The system of claim 18, wherein at least one of front surface, back surface, and flatness are used to evaluate the notch and the near notch area.

22. The system of claim 18, wherein the evaluation area encompasses the notch with specific edge-exclusion and notch-exclusion.

23. The system of claim 18, wherein the surface in the evaluation area is filtered with a low-frequency filter to remove high-frequency surface variations.

24. The system of claim 18, wherein at least one of the range metric and the deviation metric is used to evaluate the notch and the near notch area.

25. The system of claim 1, wherein at least one of the range and the deviation metric is used to sort the substrates by comparing them with a process driven cut-off value specific to notch and near notch area.

26. The system of claim 4, wherein the laser mark and the near laser mark area are evaluated with a spatial resolution of about two hundred microns.

27. The system of claim 23, wherein at least one of back surface and the flatness are used to evaluate the laser mark and the near laser mark area.

28. The system of claim 23, wherein the evaluation area encompasses the laser mark with specific edge-exclusion.

29. The system of claim 23, wherein the surface in the evaluation area is filtered with a low-frequency filter to remove high-frequency surface variations.

30. The system of claim 23, wherein at least one of the range metric and the deviation metric is used to evaluate the laser mark and the near laser mark area.

31. The system of claim 1, wherein at least one of the range metric and the deviation metric is used to sort the substrates by comparing them with a process driven cut-off value specific to laser mark and near laser mark area.

32. The system of claim 5, wherein the epitaxial pin mark is evaluated with a spatial resolution of about two hundred microns.

33. The system of claim 32, wherein at least one of front surface, back surface, and flatness are used to evaluate the epitaxial pin mark.

34. The system of claim 28, wherein the evaluation area encompasses the epitaxial pin mark within a pre-defined location on the substrate.

35. The system of claim 32, the evaluation area encompasses the epitaxial pin mark with an automatic detection routine that uses a high-frequency filter to remove low-frequency surface variations.

36. The system of claim 35, wherein the high-frequency filter is a Laplacian convolution.

37. The system of claim 30, wherein the surface in the evaluation area is filtered with a high-frequency filter to remove low-frequency surface variations.

38. The system of claim 31, wherein the evaluation area is created after detecting the epitaxial pin mark using the automatic detection routine.

39. The system of claim 38, wherein at least one of the range metric and the deviation metric is used to evaluate the epitaxial pin mark.

40. The system of claim 1, wherein at least one of the range metric and the deviation metric is used to sort the substrates by comparing them with a process driven cut-off value specific to epitaxial pin marks.

41. A processor-based method for characterizing a substrate, the method comprising the steps of:
  receiving the substrate into a free state by retaining the substrate with only point contacts that hold the substrate in a vertical position,
  using an optical substrate measurement system, performing optical measurements at points on a surface of the substrate to produce surface data,
  dividing the substrate into evaluation areas and partitioning the surface data according to the evaluation areas,
  filtering with the processor the surface data by evaluation area to remove tilt and mean surface height from the surface data, and
  characterizing the substrate based at least in part on the filtered surface data for the evaluation areas.

42. A processor-based method for characterizing fitness of a substrate for an integrated circuit process flow, the method comprising the steps of:
  receiving the substrate into a free state by retaining the substrate with only point contacts that hold the substrate in a vertical position,
  using an optical substrate measurement system, performing optical measurements at points on a surface of the substrate to produce surface data,
  computing with the processor a point slope shape value at each of the points on the surface of the substrate,
  dividing the substrate into evaluation areas and partitioning the point slope shape values according to the evaluation areas,
  computing with the processor an evaluation area slope shape value for each evaluation area, based at least in part upon the point slope shape values within the evaluation area,
  computing with the processor a substrate slope shape value for the substrate, based at least in part upon the evaluation area slope shape values,
  comparing the substrate slope shape value to a threshold that is determined based at least in part on the process flow, and
  characterizing the fitness of the substrate for the process flow based at least in part upon whether the substrate slope shape value exceeds the threshold.

43. A processor-based method for characterizing fitness of a substrate for an integrated circuit process flow, the method comprising the steps of:
  receiving the substrate into a free state by retaining the substrate with only point contacts that hold the substrate in a vertical position,
  using an optical substrate measurement system, performing optical measurements at points on a surface of the substrate to produce surface data,
  ordering the surface data into lines of data using the processor, where the line are at least one of radial lines and annular circumferential lines,
  computing with the processor a power spectral density for each of the lines of data using a Fourier transform,
  plotting power spectral density versus spatial frequency for each of the lines,
  computing with the processor a frequency shape for each of the lines based at least in part on an area under the power spectral density versus spatial frequency plot for each of the lines, and
  characterizing the fitness of the substrate for the process flow based at least in part upon the frequency shapes computed for the substrate.

44. A processor-based method for quantifying a localized feature of a substrate, the method comprising the steps of:
  receiving the substrate into a free state by retaining the substrate with only point contacts that hold the substrate in a vertical position,
  defining with the processor an evaluation area of the substrate around the localized feature,
  using an optical substrate measurement system, performing optical measurements at points on a surface within the evaluation area of the substrate to produce surface data,
  applying a filtering routine to the surface data with the processor to remove unwanted characteristics of the surface data, computing with the processor a metric based at least in part on filtered surface data, and quantifying the localized feature of the substrate based at least in part upon the computed metric.

45. The method of claim 44, wherein the step of defining an evaluation area comprises accepting a user-defined evaluation area.

46. The method of claim 44, wherein the step of defining an evaluation area comprises accepting a predefined coordinate location on the substrate as the evaluation area.

47. The method of claim 44, wherein the step of defining an evaluation area comprises applying a filtering routine to the substrate surface data to detect the localized feature, and defining the evaluation area around the localized feature.

48. The method of claim 44, wherein the filtering routine is a Laplacian curvature filter.

49. The method of claim 44, wherein the computed metric is at least one of peak-to-valley range of height values within the evaluation area, and magnitude of one of the greatest height and the lowest depth in the surface of the substrate within the evaluation area.

* * * * *